(12) United States Patent
Li

(10) Patent No.: US 11,462,598 B2
(45) Date of Patent: Oct. 4, 2022

(54) OLED DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Wenqi Li, Wuhan (CN)

(\*) Notice: Subject to any disclaimer, the term of this patent is extended or adjusted under 35 U.S.C. 154(b) by 547 days.

(21) Appl. No.: 16/467,047

(22) PCT Filed: Apr. 2, 2019

(86) PCT No.: PCT/CN2019/080962
§ 371 (c)(1),
(2) Date: Jun. 6, 2019

(87) PCT Pub. No.: WO2020/168619
PCT Pub. Date: Aug. 27, 2020

(65) Prior Publication Data
US 2021/0408170 A1    Dec. 30, 2021

(30) Foreign Application Priority Data
Feb. 18, 2019 (CN) .......................... 201910120477.6

(51) Int. Cl.
*H01L 27/32* (2006.01)
*G06V 40/13* (2022.01)

(52) U.S. Cl.
CPC ...... *H01L 27/3234* (2013.01); *G06V 40/1318* (2022.01); *H01L 27/3246* (2013.01); *H01L 27/3248* (2013.01); *H01L 27/3258* (2013.01); *H01L 27/3272* (2013.01); *H01L 27/3276* (2013.01)

(58) Field of Classification Search
CPC ............. H01L 27/3272; H01L 27/3248; H01L 27/323; H01L 27/3258; H01L 51/5284; G06V 40/1318
See application file for complete search history.

(56) References Cited

U.S. PATENT DOCUMENTS

| 2011/0057189 A1* | 3/2011 | Jeong | .................... G06F 3/0421 |
| | | | 257/E21.414 |
| 2016/0064467 A1* | 3/2016 | Ota | .................... H01L 27/3265 |
| | | | 257/40 |

(Continued)

FOREIGN PATENT DOCUMENTS

| CN | 107978624 A | 5/2018 |
| CN | 106242453 A | 7/2018 |

(Continued)

*Primary Examiner* — David A Zarneke

(57) ABSTRACT

An organic light emitting diode (OLED) display panel is provided, which includes a thin film transistor (TFT) array, a second metal layer, and an insulating layer disposed on the TFT array, a light blocking layer disposed on the insulating layer, a planarization layer disposed on the light blocking layer, an anode metal layer disposed on the planarization layer, and the light blocking layer provided with a plurality of holes; wherein the second metal layer includes a source-drain metal layer, and an interconnect hole is disposed in an interlayer structure between the source-drain metal layer and the anode metal layer and is electrically connected to the source-drain metal layer and the anode metal layer.

6 Claims, 7 Drawing Sheets

(56) References Cited

U.S. PATENT DOCUMENTS

| | | | |
|---|---|---|---|
| 2017/0236885 A1* | 8/2017 | Koshihara | G09G 3/32 |
| | | | 257/89 |
| 2019/0220644 A1 | 7/2019 | Sun et al. | |
| 2020/0026899 A1 | 1/2020 | Sun et al. | |
| 2020/0075695 A1 | 3/2020 | Zhao et al. | |

FOREIGN PATENT DOCUMENTS

| CN | 108242462 A | 7/2018 |
|---|---|---|
| CN | 108922905 A | 11/2018 |
| CN | 109148540 A | 1/2019 |

\* cited by examiner

OLED DISPLAY PANEL

FIELD OF INVENTION

The present invention relates to a field of display technology, and in particular, to an organic light emitting diode (OLED) display panel.

BACKGROUND OF INVENTION

With the strong demand for full-screen mobile phones, optical screen fingerprint recognition technology has overcome the weakness of capacitive fingerprint recognition technology and is suitable for full-screens, thereby become the hottest topic in front-end technology research and development in recent years. A basic principle of the optical screen fingerprint recognition technology is that when a finger touches a specific area of a screen, light emitted by an organic light emitting diode (OLED) is reflected by the finger and passes through an OLED panel to reach a photoelectric sensor placed on the back of the panel, and the fingerprint information is compared and recognized by the photoelectric sensor to unlock the OLED display.

However, in an optical fingerprint recognition panel, when the finger touches the screen, light diffuse reflection is generated after light hits the finger. The light reflected by the finger is received by the photoelectric sensor together with stray light in the environment, which makes it difficult to accurately identify fingerprints.

Technical Problem

In the optical fingerprint recognition panel, when the finger touches the screen, the light diffuse reflection is generated after the light hits the finger. The light reflected by the finger is received by the photoelectric sensor together with the stray light in the environment, which makes it difficult to accurately identify the fingerprints.

SUMMARY OF INVENTION

Technical Solution

An OLED display panel, including: a thin film transistor (TFT) array; a second metal layer disposed on the TFT array; an insulating layer disposed on the TFT array and covering the second metal layer; a light blocking layer disposed on the insulating layer, wherein the light blocking layer is provided with a plurality of holes for the light reflected by the finger to pass through; a photo sensor disposed on a side of the TFT array far from the second metal layer and configured to receive the light passing through the hole; a planarization layer disposed on the light blocking layer; an anode metal layer and a pixel definition layer disposed on the planarization layer; wherein, the second metal layer includes a source-drain metal layer, and an interconnect hole is disposed in an interlayer structure between the source-drain metal layer and the anode metal layer and is electrically connected to the source-drain metal layer and the anode metal layer.

Furthermore, the interconnect hole includes a first via through the planarization layer, and a second via is disposed in the insulating layer and extended to a surface of the source-drain metal layer, the first via is connected to the second via.

Furthermore, an aperture of the first via is larger than an aperture of the second via.

Furthermore, an orthographic projection of the first via on the second metal layer encompasses an orthographic projection of the second via on the second metal layer.

Furthermore, the light blocking layer is made of conductive metal, the second metal layer further includes a first high-voltage source line spaced from the source-drain metal layer, a third via extending to a surface of the first high-voltage source line is disposed in the insulating layer, and the light blocking layer is electrically connected to the first high-voltage source line through the third via.

Furthermore, the light blocking layer is made of conductive metal, the light blocking layer includes mutually independent a first portion and a second portion, the interconnect hole includes a first connecting hole disposed on the planarization layer and extending to a surface of the first portion and a second connecting hole disposed on the insulating layer and extending to a surface of the source-drain metal layer, the anode metal layer is electrically connected to the first portion through the first connecting hole, and the first portion is electrically connected to the source-drain metal layer through the second connecting hole.

Furthermore, the second metal layer further includes a second high-voltage source line, a third connecting hole extending to a surface of the second high-voltage source line is disposed on the insulating layer, and the second portion is electrically connected to the second high-voltage source line through the third connecting hole.

Furthermore, an orthographic projection of the first connecting hole on the second metal layer is independent of an orthographic projection of the second connecting hole on the second metal layer.

Furthermore, an interconnect hole extends from a top surface of the planarization layer to a surface of the source-drain metal layer, a through hole is formed in the light blocking layer and an aperture of the through hole is larger than an aperture of the interconnect hole, and the interconnect hole pass the through hole.

Furthermore, the through hole and the hole are formed before the formation of the planarization layer, and the interconnect hole is made by a process.

Furthermore, the TFT array includes: a substrate; a semiconductor layer disposed on the substrate; a first gate insulating layer disposed on semiconductor layer; a first gate metal layer and a second gate insulating layer disposed on the first gate insulating layer; a second gate metal layer and an interlayer dielectric layer disposed on the second gate insulating layer; and the second metal layer disposed on the interlayer dielectric layer.

The Beneficial Effects

By using the light blocking layer to block the passage of the stray light in the environment to prevent the interference generated by the stray light, thereby to accurately identify the fingerprint. At the same time, the electrical connection between the light blocking layer and the high-voltage source line is used to improve the conductivity uniformity of the high-voltage source line, also to improve the yield of the manufacturing techniques and to reduce the number of masks.

DESCRIPTION OF DRAWINGS

In order to illustrate the technical solutions of the present disclosure or the related art in a clearer manner, the drawings desired for the embodiments or the related art will be described hereinafter briefly. Obviously, the following drawings merely relate to some embodiments of the present disclosure, and based on these drawings, a person skilled in the art may obtain the other drawings without any creative effort.

REFERENCE NUMERAL

Figure 1:
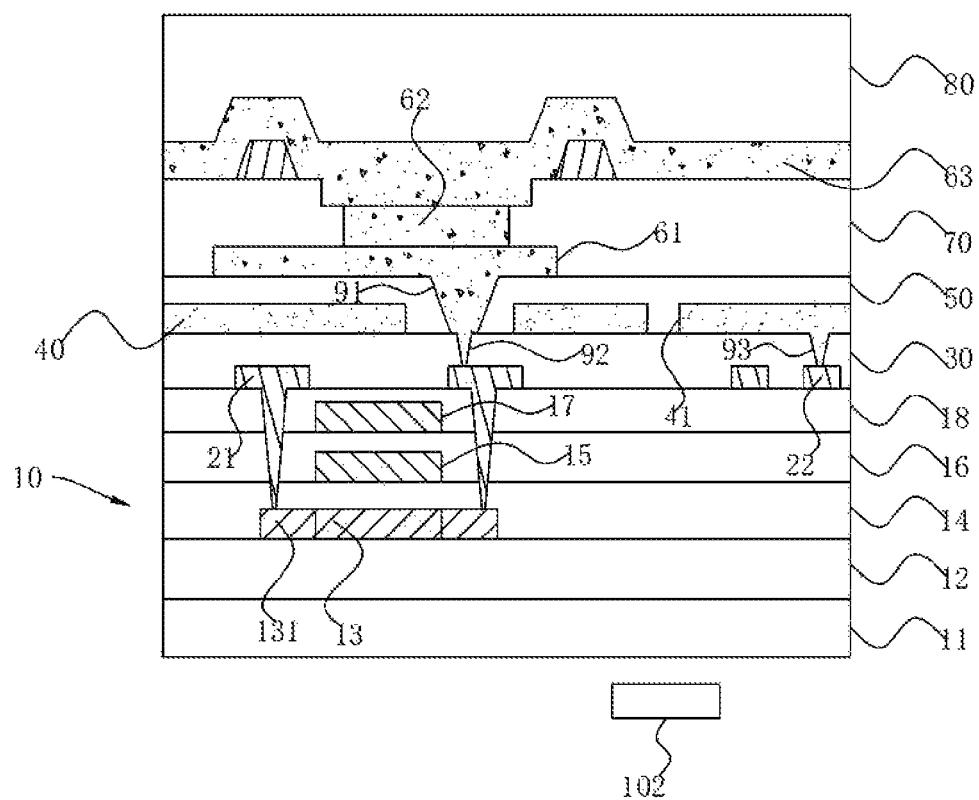
FIG. 1 is a schematic diagram showing a structure of an organic light emitting diode (OLED) display panel according to Embodiment 1 of the present invention.

10. thin film transistor (TFT) array; 11. substrate; 12. buffer layer; 13. semiconductor layer; 131. doping region; 14. first gate insulating layer; 15. first gate metal layer; 16. second gate insulating layer; 17. second gate metal layer; 18. interlayer dielectric layer; 21. source-drain metal layer; 22. first high-voltage source line; 23. second high-voltage source line; 30. insulating layer; 40. light blocking layer; 41. hole; 42. through hole; 43. first portion; 44. second portion; 50. planarization layer; 61. anode metal layer; 62. light emitting layer 63. cathode metal layer; 70. pixel definition layer; 80. encapsulation layer; 90. interconnect hole; 91. first via; 92. second via; 93. third via; 94. first connecting hole; 95. second connecting hole; 96. third connecting hole; 101. signal electrode; 102. photoelectric sensor.

DETAILED DESCRIPTION OF PREFERRED EMBODIMENTS

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

The invention is directed to an existing optical screen fingerprint recognition display panel, which the finger touches the screen and the light diffuse reflection is generated after the light hits the finger. The light reflected by the finger is received by the photoelectric sensor together with the stray light in the environment, which makes it difficult to accurately identify the fingerprints. The present invention can solve the above problems.

Embodiment 1

An organic light emitting diode (OLED) display panel as shown in FIG. 1, the OLED display panel includes a thin film transistor (TFT) array 10, and a second metal layer, an insulating layer 30, a light blocking layer 40, and a planarization layer 50 which are sequentially stacked on the TFT array 10.

The insulating layer 30 is disposed on the TFT array 10 and covered the second metal layer, material of the insulating layer is made of, but not limited to, silicon nitride and silicon oxide.

The light blocking layer 40 is disposed on the insulating layer, and the light blocking layer 40 is provided with a plurality of holes 41 distributing evenly which used for light reflected by a finger to pass through. A side of the TFT array 10 away from the second metal layer is disposed with a photoelectric sensor 102 that receives the light passing through the hole 41, and the OLED display panel has a fingerprint identification area corresponding to the photoelectric sensor 102.

The planarization layer 50 is disposed on the light blocking layer 40, and the OLED display panel further includes an anode metal layer 61 and a pixel definition layer 70 disposed on the planarization layer 50. A light emitting layer 62 is disposed on the anode metal layer 61, a cathode metal layer 63 is disposed on the light emitting layer 62 and an encapsulation layer is disposed on the cathode metal layer 63.

Specifically, the TFT array 10 includes a substrate 11, a buffer layer 12, a semiconductor layer 13 disposed on the substrate 11, a first gate insulating layer 14 disposed on the semiconductor layer 13, a first gate metal layer 15, and a second gate insulating layer 16 disposed on the first gate insulating layer 14, and a second gate metal layer 17 and an interlayer dielectric layer 18 disposed on the second gate insulating layer 16. The second metal layer being disposed on the interlayer dielectric layer 18.

The second metal layer includes a source-drain metal layer 21, the semiconductor layer 13 includes an active island, and the source-drain metal layer 21 is connected to a doping region on the active island. An interconnect hole 90 is disposed in an interlayer structure between the source-drain metal layer and the anode metal layer and is electrically connected to the source-drain metal layer 21 and the anode metal layer 61.

The light generated from the light source is reflected by the finger, the light reflected by the finger passes through the hole 41 on the light blocking layer 40, and then passes through the other layer structure and is received by the photoelectric sensor 102. The light blocking layer 40 is used to block the passage of the stray light in the environment to prevent the interference generated by the stray light, thereby to accurately identify the fingerprint.

Specifically, the interconnect hole 90 includes a first via 91 throughout the planarization layer 50, and a second via 92 disposed in the insulating layer 30 and extending to a surface of the source-drain metal layer 21, the first via 91 is connected to the second via 92.

Furthermore, an aperture of the first via 91 is larger than an aperture of the second via 92, and an axis of the first via 91 coincides with an axis of the second via 92, an orthographic projection of the first via 91 projected on the second metal layer along the thickness direction of the source-drain metal layer 21 encompasses an orthographic projection of the second via 92 projected on the second metal layer along the thickness direction of the source-drain metal layer 21.

The anode metal layer 61 in the anode metal layer 61 is electrically connected to the source-drain metal layer 21 through the first via 91 and the second via 92. The first via 91 and the second via 92 are sleeve holes, and the aperture of the first via 91 is larger than the aperture of the second via 92, thereby to save a planar area and to facilitate the high-resolution design.

Specifically, the light blocking layer 40 is made of a conductive metal, and the second metal layer further includes a first high-voltage source line 22, a third via 93 extending to a surface of the first high-voltage source line 22 is disposed in the insulating layer 30, and the light blocking layer 40 is electrically connected to the first high-voltage source line 22 through the third via 93.

By electrically connecting the light blocking layer 40 to the first high-voltage source line 22, while the light blocking layer 40 is used to block stray light, the light blocking layer 40 is used as a high-voltage source line, thereby to increase conductivity uniformity of the high-voltage source line.

Embodiment 2

Figure 2:
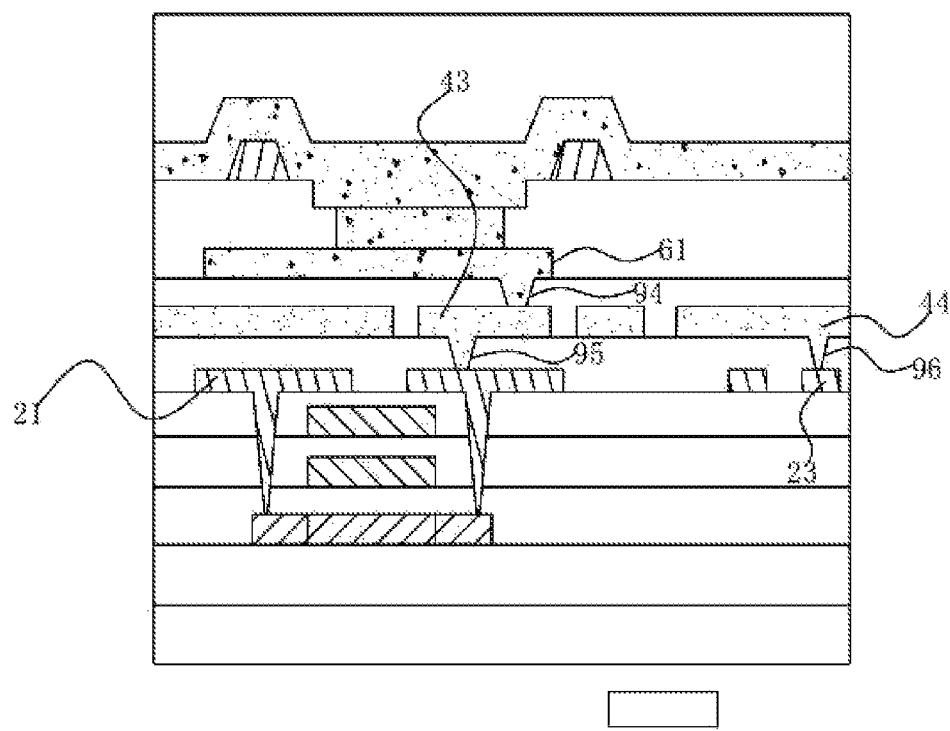
FIG. 2 is a schematic diagram showing a structure of an OLED display panel according to Embodiment 2 of the present invention.

An OLED display panel, as shown in FIG. 2, differs from the embodiment 1 in the arrangement of the interconnect hole 90 and the light blocking layer 40.

Specifically, the light blocking layer 40 is made of a conductive metal, the light blocking layer 40 includes mutually independent a first portion 43 and a second portion 44, the interconnect hole 90 includes a first connecting hole 94 disposed on the planarization layer 50 and extending to a surface of the first portion 43, and a second connecting hole 95 disposed on the insulating layer 30 and extending to a surface of the source-drain metal layer 21, the anode metal layer 61 is electrically connected to the first portion 43 through the first connecting hole 94, the first portion 43 is electrically connected to the source-drain metal layer 21 through the second connecting hole 95.

The second metal layer further includes a second high-voltage source line 23, a third connecting hole 96 extending to a surface of the second high-voltage source line 23 is disposed on the insulating layer 30, and the second portion 44 is electrically connected to the second high-voltage source line 23 through the third connecting hole 96.

The first portion 43 serves as a connection point between the anode metal layer 61 and the semiconductor layer 13, while using the second portion 44 isolated from the first portion 43 as a high-voltage source line, to increase the conductivity uniformity of the high-voltage source line.

Figure 3:
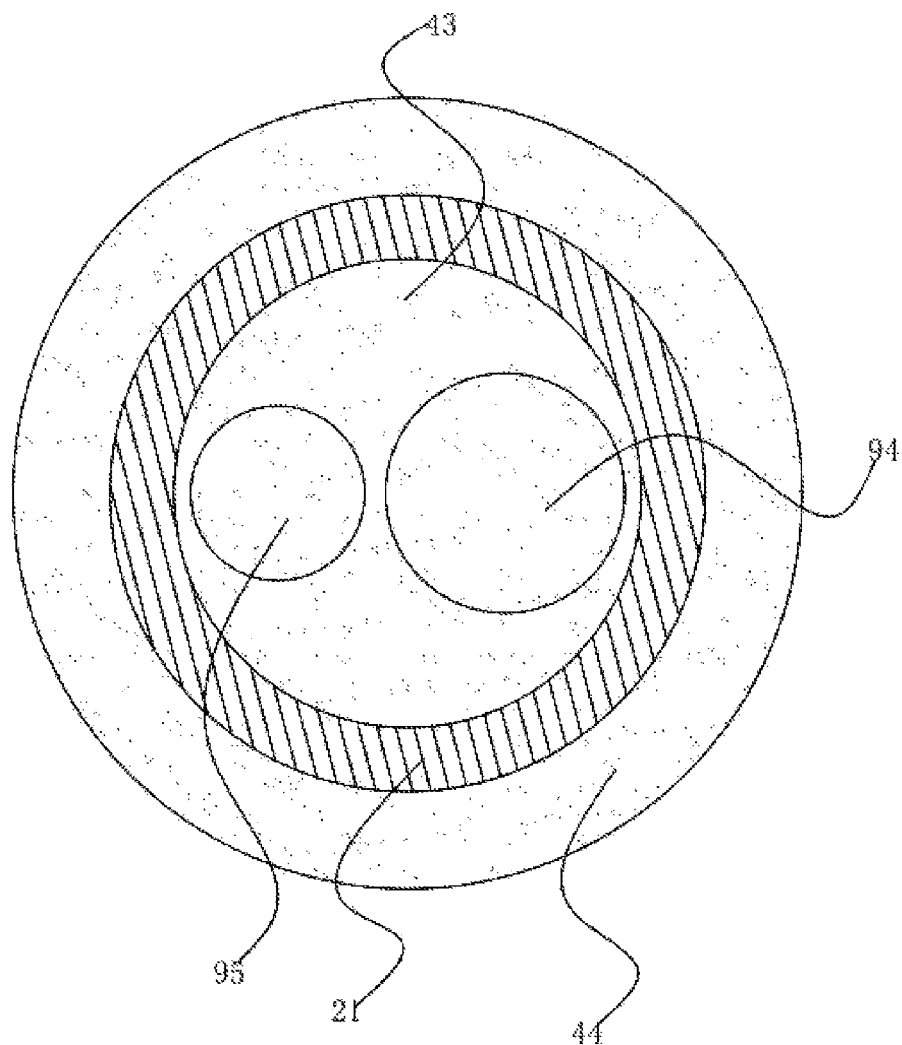
FIG. 3 is a schematic diagram showing positions of a first connecting hole and a second connecting hole according to Embodiment 2 of the present invention.

As shown in FIG. 3, furthermore, an orthographic projection of the first connecting hole 94 projected on the second metal layer along the thickness direction of the source-drain metal layer 21 is independent of an orthographic projection of the second connecting hole 95 projected on the second metal layer along the thickness direction of the source-drain metal layer 21.

The planarization layer 50 is prevented from remaining in the connection hole when the connection hole is dug, which improves the yield of the manufacturing process.

Embodiment 3

Figure 4:
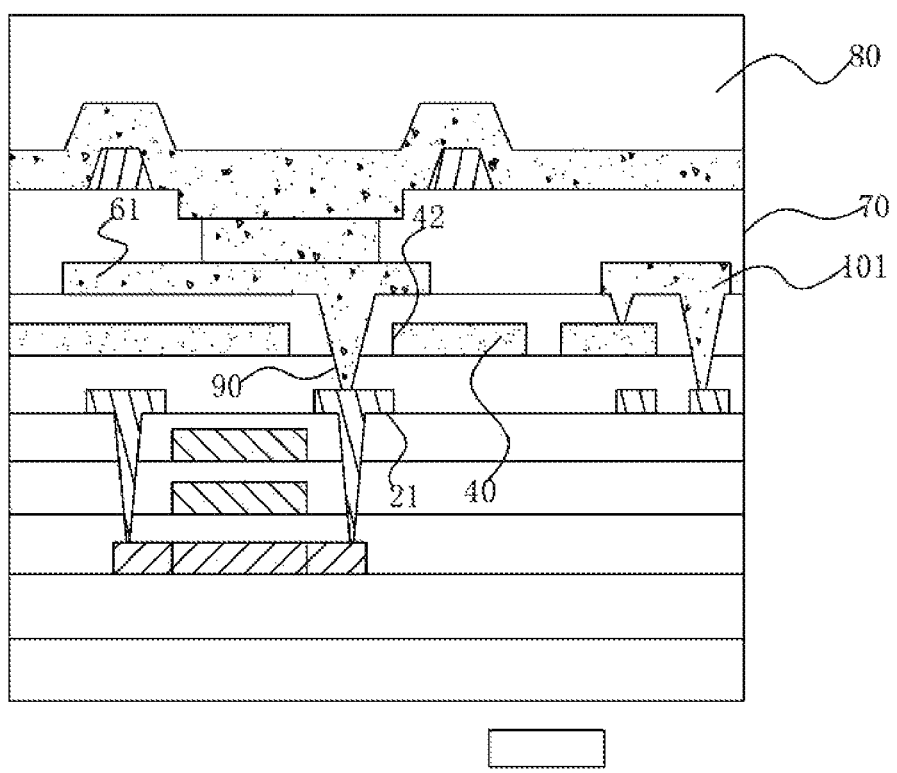
FIG. 4 is a schematic diagram showing a structure of an OLED display panel according to Embodiment 3 of the present invention.

An OLED display panel, as shown in FIG. 4, differs from the embodiment 1 in the arrangement of the interconnect hole 90 and the light blocking layer 40.

Specifically, an interconnect hole 90 extends from a top surface of the planarization layer 50 to a surface of the source-drain metal layer 21, a through hole 42 is formed in the light blocking layer 40 and an aperture of the through hole 42 is larger than an aperture of the interconnect hole 90, and the interconnect hole 90 pass the through hole 42.

The through hole 42 and the hole 41 are formed before the formation of the planarization layer 50, and the interconnect hole 90 is made by a process.

The interconnect hole 90 is integrally formed and can be manufactured through a single process, which reduces manufacturing processes and saves costs.

The planarization layer 50 is further provided with a signal electrode 101 which is formed by a process of the anode metal layer 61. The light blocking layer 40 is made of a conductive metal, and a connection via is disposed between the signal electrode 101 and the high-voltage source line and the light blocking layer 40. The signal electrode 101 is electrically connected to the high-voltage source line and the light blocking layer 40 through the connection via.

Figure 5:
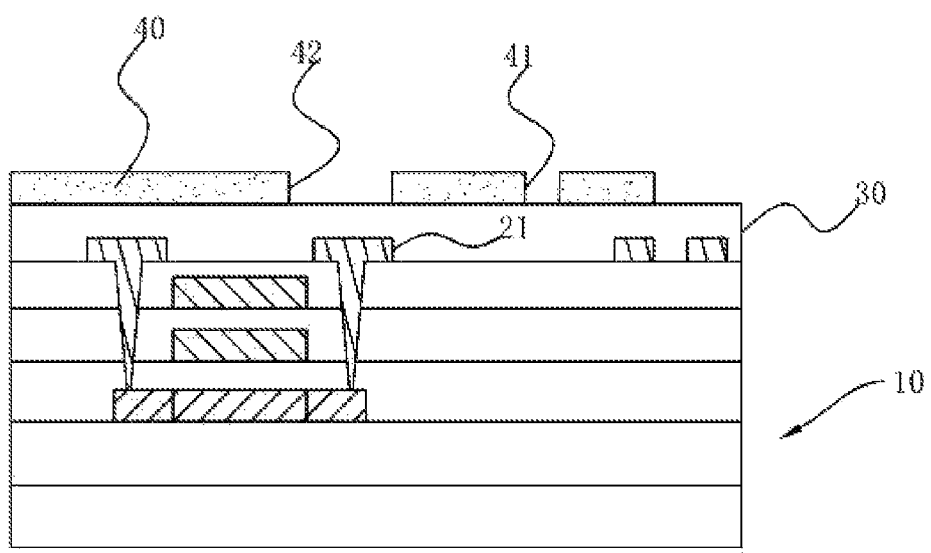
FIGS. 5-7 are schematic diagrams showing a manufacturing process of the OLED display panel according to Embodiment 3 of the present invention.
Figure 6:
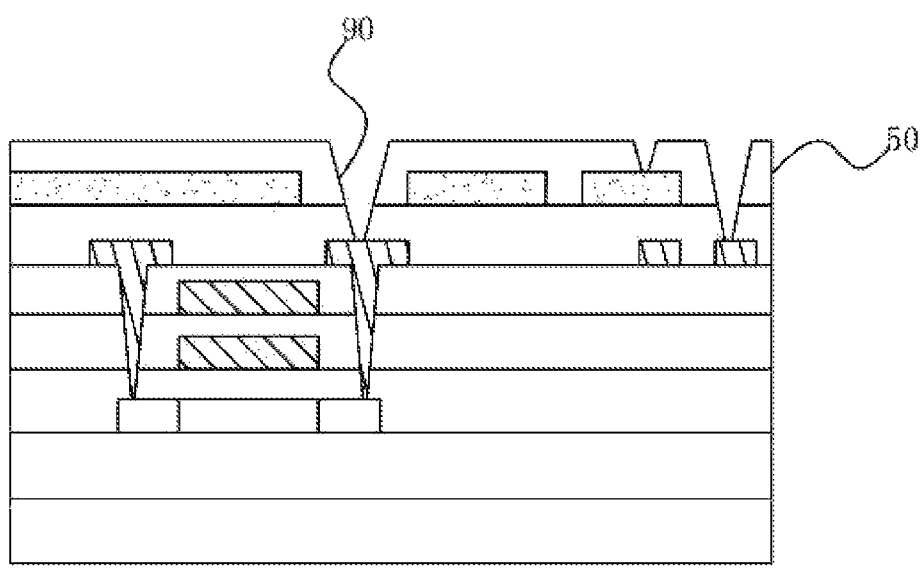
Figure 7:
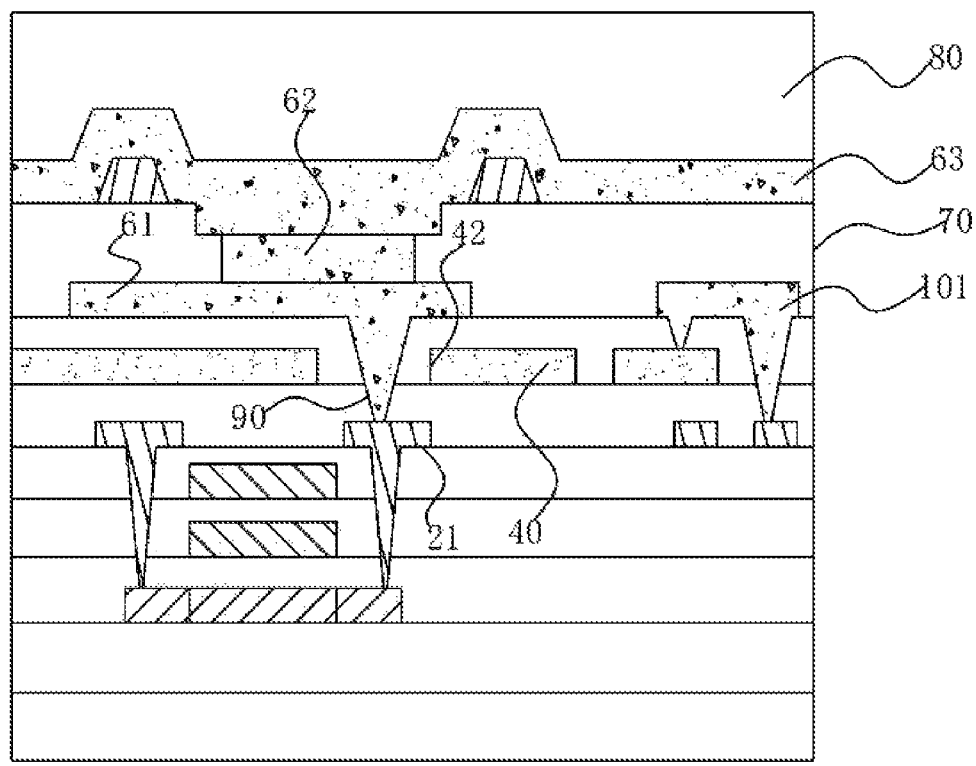

As shown in FIG. 5 to FIG. 7, FIG. 5 to FIG. 7 are schematic diagrams showing a manufacturing process of an OLED display panel.

As shown in FIG. 5, after the second metal layer, the insulating layer 30, and the light blocking layer 40 are sequentially formed on the TFT array 10, the through hole 42 and the hole 41 are formed at preset positions on the second metal layer.

As shown in FIG. 6, the planarization layer 50 is formed on the light blocking layer 40, and an interconnect hole 90 and a connection via are formed in the planarization layer 50 by a single process.

As shown in FIG. 7, the anode metal layer 61, the pixel definition layer 70, and the encapsulation layer 80 are formed on the planarization layer 50, and the anode metal layer 61 fills the interconnect hole 90.

The beneficial effects of the invention are: by using the light blocking layer 40 to block the passage of the stray light in the environment to prevent the interference generated by the stray light, thereby to accurately identify the fingerprint. At the same time, the electrical connection between the light blocking layer 40 and the high-voltage source line is used to improve the conductivity uniformity of the high-voltage source line.

Embodiments of the present invention have been described, but not intending to impose any unduly constraint to the appended claims. For the skilled persons of ordinary skill in the art, any modification of equivalent structure or equivalent process made according to the disclosure and drawings of the present invention is considered encompassed in the scope of protection defined by the claims of the present invention.

What is claimed is:

1. An organic light emitting diode (OLED) display panel, comprising:
a thin film transistor (TFT) array;
a second metal layer disposed on the TFT array;
an insulating layer disposed on the TFT array and covering the second metal layer;
a light blocking layer disposed on the insulating layer, wherein the light blocking layer is provided with a plurality of holes for light reflected by a finger to pass through;
a photo sensor disposed on a side of the TFT array far from the second metal layer and configured to receive the light passing through the plurality of holes;
a planarization layer disposed on the light blocking layer;
an anode metal layer and a pixel definition layer disposed on the planarization layer;
wherein the second metal layer comprises a source-drain metal layer, and an interconnect hole is disposed in an interlayer structure between the source-drain metal layer and the anode metal layer and is electrically connected to the source-drain metal layer and the anode metal layer;

wherein the interconnect hole comprises a first via through the planarization layer and a first high-voltage source line spaced from the source-drain metal layer, and a second via is disposed in the insulating layer and extended to a surface of the source-drain metal layer, the first via is connected to the second via; and wherein the light blocking layer is made of a conductive metal, a third via extending to a surface of the first high-voltage source line is disposed in the insulating layer, and the light blocking layer is electrically connected to the first high-voltage source line through the third via.

2. The OLED display panel according to claim 1, wherein an aperture of the first via is larger than an aperture of the second via.

3. The OLED display panel according to claim 2, wherein an orthographic projection of the first via on the second metal layer encompasses an orthographic projection of the second via on the second metal layer.

4. The OLED display panel according to claim 1, wherein an interconnect hole extends from a top surface of the planarization layer to a surface of the source-drain metal layer, a through hole is formed in the light blocking layer and an aperture of the through hole is larger than an aperture of the interconnect hole, and the interconnect hole pass the through hole.

5. The OLED display panel according to claim 4, wherein the through hole and the plurality of holes are formed before the formation of the planarization layer, and the interconnect hole is made by a process.

6. The OLED display panel according to claim 1, wherein the TFT array comprises:
 a substrate;
 a semiconductor layer disposed on the substrate;
 a first gate insulating layer disposed on semiconductor layer;
 a first gate metal layer and a second gate insulating layer disposed on the first gate insulating layer;
 a second gate metal layer and an interlayer dielectric layer disposed on the second gate insulating layer; and
  the second metal layer disposed on the interlayer dielectric layer.

* * * * *